United States Patent
Zhou

(10) Patent No.: US 10,315,233 B2
(45) Date of Patent: Jun. 11, 2019

(54) FLEXIBLE SUBSTRATE TREATMENT DEVICE

(71) Applicant: BOE TECHNOLOGY GROUP CO., LTD., Beijing (CN)

(72) Inventor: Weifeng Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 480 days.

(21) Appl. No.: 14/127,189

(22) PCT Filed: Dec. 3, 2012

(86) PCT No.: PCT/CN2012/085771
§ 371 (c)(1),
(2) Date: Dec. 18, 2013

(87) PCT Pub. No.: WO2014/015610
PCT Pub. Date: Jan. 30, 2014

(65) Prior Publication Data
US 2015/0000840 A1    Jan. 1, 2015

(30) Foreign Application Priority Data
Jul. 27, 2012    (CN) .......................... 2012 1 0265514

(51) Int. Cl.
*B08B 3/04* (2006.01)
*B08B 3/08* (2006.01)
(Continued)

(52) U.S. Cl.
CPC ............... *B08B 3/041* (2013.01); *B08B 3/08* (2013.01); *C23G 3/021* (2013.01);
(Continued)

(58) Field of Classification Search
CPC ...... H05K 1/0393; C23G 3/021; B44C 1/227; B08B 3/041; B08B 3/08; H01L 21/67057; H01L 21/67086
See application file for complete search history.

(56) References Cited

U.S. PATENT DOCUMENTS 3,310,062 A * 3/1967 Little ..................... D06B 3/201
118/33
6,864,186 B1 * 3/2005 Yates ................ H01L 21/67086
134/1.2
(Continued)

FOREIGN PATENT DOCUMENTS

CN        201372137 Y    12/2009
CN        202090088 U    12/2011
(Continued)

OTHER PUBLICATIONS

Machine Translation of CN201372137Y, translated on Feb. 4, 2016, p. 1-9.*
(Continued)

*Primary Examiner* — Karla A Moore
*Assistant Examiner* — Margaret D Klunk
(74) *Attorney, Agent, or Firm* — Ladas & Parry LLP

(57) ABSTRACT

A flexible substrate treatment device comprising at least one tank that accommodates treatment liquid, winding rollers including a main roller and a driven roller located above the treatment liquid, a positioning roller located in the treating liquid in each tank, a detecting unit configured to detect radius or diameter of at least one of the winding rollers, and a movable discharge member fixed to a side wall of each tank, including a movable discharge port configured to discharge the treatment liquid and a discharge port position
(Continued)

controlling mechanism, wherein the movable discharge port can be moved in a direction X perpendicular to a bottom wall of the tank.

18 Claims, 2 Drawing Sheets

(51) Int. Cl.
*C23G 3/02* (2006.01)
*H05K 1/03* (2006.01)
*H01L 21/67* (2006.01)
*H05K 3/02* (2006.01)

(52) U.S. Cl.
CPC .. *H01L 21/67057* (2013.01); *H01L 21/67086* (2013.01); *H05K 1/0393* (2013.01)

(56) References Cited

U.S. PATENT DOCUMENTS

| | | | |
|---|---|---|---|
| 2006/0162466 A1* | 7/2006 | Wargo | G01F 1/363 73/861.63 |
| 2009/0159210 A1 | 6/2009 | Kim | |

FOREIGN PATENT DOCUMENTS

| | | | |
|---|---|---|---|
| CN | 102790002 A | 11/2012 | |
| JP | 0575219 A | 3/1993 | |
| JP | 0734544 U | 6/1995 | |
| JP | 1177435 A | 3/1999 | |
| JP | 2001-158986 A | 6/2001 | |
| JP | 2001-271190 A | 10/2001 | |
| JP | 2011-074416 A | 4/2011 | |
| KR | 20030057452 A | 7/2003 | |
| KR | 20060053995 A | 5/2006 | |
| KR | 20100061035 A | 6/2010 | |
| KR | 20110045701 A | 5/2011 | |

OTHER PUBLICATIONS

Machine Translation of JP20011-074416, translated on Feb. 4, 2016, p. 1-6.*
Machine Translation of CN202090088U, translated on Feb. 4, 2016, p. 1-8.*
International Preliminary Report on Patentability Appln. No. PCT/CN2012/085771; dated Jan. 27, 2015.
Korean Office Action Appln. No. 10-2014-7000993; dated Feb. 9, 2015.
International Search Report dated Feb. 5, 2013; PCT/CN2012/085771.
First Chinese Office Action dated Jun. 5, 2014; Appln. No. 201210265514.0.
Korean Office Action Appln. No. 10-2014-7000993; dated Aug. 19, 2015.
Korean Office Action dated Feb. 12, 2016; Appln. No. 10-2014-7000993.
Japanese Office Action dated Oct. 24, 2016; Appln. No. 2015-523367.

* cited by examiner

FLEXIBLE SUBSTRATE TREATMENT DEVICE

FIELD OF THE INVENTION

Embodiments of the present invention relate to a flexible substrate treatment device.

BACKGROUND

With continuous development of flexible display products, a Roll-to-Roll process will be gradually used as main manufacturing process in future display production field, replacing the current method of fabricating display product one by one, by virtue of its low cost and characteristics of high efficiency production.

FIG. 1 is a schematic diagram of conventional roll-to-roll etching apparatus, comprising an etching tank 12 accommodating an etching liquid 11; winding rollers located above the etching tank 12, which includes a main roller 13 and a driven roller 14; and a positioning roller 15 located in the etching liquid 11, wherein a flexible substrate 16 is passed around the driven roller 14, the positioning roller 15 and the main roller 13 along its movement direction.

As the apparatus shown in FIG. 1 operates, a flexible substrate 16 is performed through a roll-to-roll etching process. The main roller 13 is rotated and the flexible substrate 16 is driven from the driven roller 14 toward the main roller 13 and passes around the positioning roller 15 in the etching liquid 11. During being immersed in the etching liquid, part of the flexible substrate 16 is etched.

However, with regard to the conventional roll-to-roll etching process, since the diameters of the main roller 13 and the driven roller 14 are both changed with the number of the wrapped flexible substrate layers, the line velocities of the moving flexible substrate on the main roller 13 in uniform rotation and the driven roller 14 will constantly change. As a result, etching time of the immersed flexible substrate 16 is changed with the diameters of the main roller 13 and the driven roller 14 being changed, which will leads to uneven size of devices formed on the flexible substrate and influences qualities of flexible display products.

SUMMARY

Embodiments of the present invention provide a flexible substrate treatment device which overcomes the problem of treating time of the flexible substrate being changed with the variation of the diameter of the winding roller during treatment by a conventional roll-to-roll treatment device.

An embodiment of the invention provides a flexible substrate treatment device, comprising at least one tank that accommodates treatment liquid; winding rollers including a main roller and a driven roller located above the treatment liquid; a positioning roller located in the treatment liquid in each tank; a detecting unit configured to detect radius or diameter of at least one of the winding rollers; and a movable discharge member fixed to a side wall of each tank, including a movable discharge port configured to discharge the treatment liquid and a movable discharge port position controlling mechanism; wherein the position controlling mechanism is configured to control movement of the corresponding movable discharge port in a direction perpendicular to a bottom wall of the tank based on a detection result of the detecting unit.

In the flexible substrate treatment device according to the embodiment of the present invention, since the detecting unit notifies the discharge port position controlling mechanism and the liquid supplying member after detecting change of radius or diameter of the winding roller, and position of the movable discharge port is adjusted to a higher position and treatment liquid thus is added, or position of the movable discharge port is adjusted to a lower position and treatment liquid thus is discharged; therefore, length of the part of the flexible substrate immersed in the treatment liquid may be changed in proportion with the variation of radius or diameter of the winding roller by adjustment of the liquid level of the treatment liquid, thereby treating time of the flexible substrate in the treatment liquid maintaining to be constant and thus ensuring uniformity in size of devices in the flexible substrate and enhancing qualities of the flexible display products.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
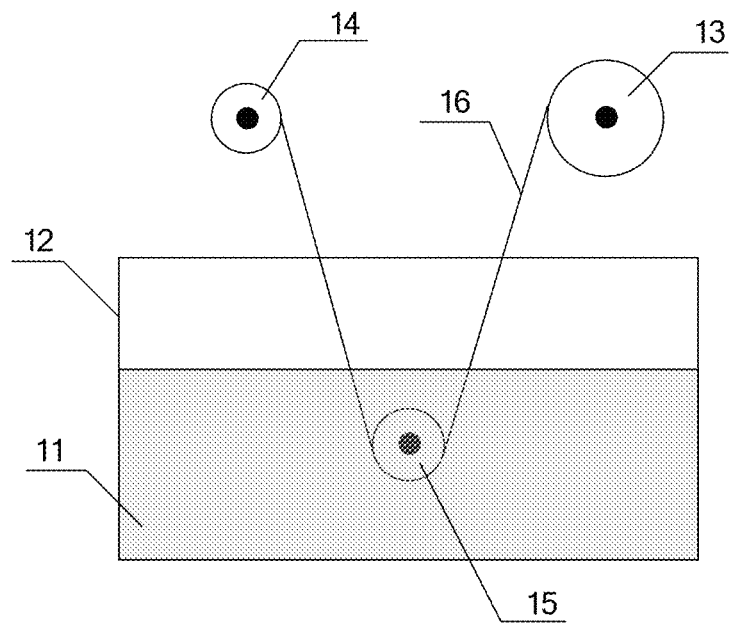
FIG. 1 is a schematic view of a conventional roll-to-roll etching apparatus.
Figure 2:
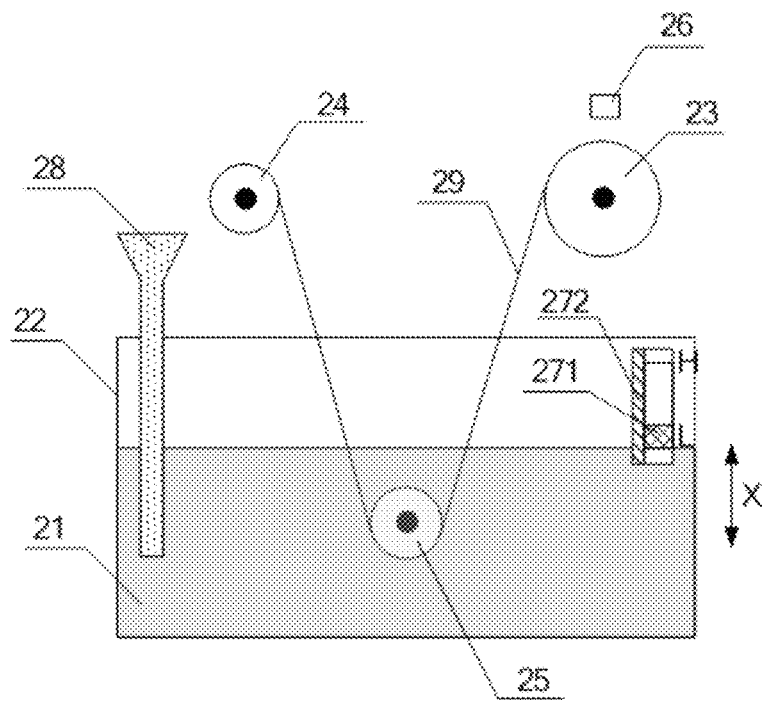
FIG. 2 is a schematic view of a flexible substrate treatment device with a single tank provided according to an embodiment of the present invention.

A flexible substrate treatment device is provided according to an embodiment of the invention. As illustrated in FIG. 2 (in which a device with a single tank is shown), the device comprises at least one tank 22 accommodating treatment liquid 21, winding rollers including a main roller 23 and a driven roller 24 located above the treatment liquid 21, a positioning roller 25 located in the treatment liquid 21, a detecting unit 26 configured to detect radius or diameter of at least one winding roller, and a movable discharge member fixed to a side wall of each tank 22, which includes a movable discharge port 271 configured to discharge the treatment liquid 21 and a discharge port position controlling mechanism 272, wherein the movable discharge port 271 is able to move in the direction X perpendicular to the bottom wall of the tank 22 and the position controlling mechanism 272 is configured to control the movement of the corresponding movable discharge port 271 in the direction X perpendicular to the bottom wall of the tank 22 according to the detection result of the detecting unit 26. For example, the movable discharge port 271 may be moved to a high position H, a low position L or a medial position between the high position H and the low position L. In FIG. 2, the movable discharge port 271 is located in the low position L.

The flexible substrate treatment device can further include, illustrated as FIG. 2, a liquid supplying member 28 configured to fill treatment liquid 21 into the tank 22.

As the flexible substrate treatment device as illustrated in FIG. 2 operates, the flexible substrate 29 is treated, and the main roller 23 is rotated to drive the flexible substrate 29 to make the flexible substrate 29 to be passed around the positioning roller 25 in the treatment liquid 21 and be drawn from the driven roller 24 towards the main roller 23. When immersed in the treatment liquid 21, the flexible substrate 29 is treated.

The detecting unit 26 is disposed in a radial direction relative to the main roller 23 and to detect radius or diameter of the main roller 23. When the radius or diameter of the main roller 23 is changed with quantity of the flexible substrate 29 wrapped around the roller, the detecting unit 26 detects the change of the radius or diameter of the main roller and notifies the discharge port position controlling mechanism 272 and the liquid supplying member 28. The discharge port position controlling mechanism 272 controls movement of the movable discharge port 271 in the direction X perpendicular to the bottom wall of the tank 22 based on the detection result of the detecting unit 26 so that the movable discharge port 271 may be located at a high position H, a low position L or a medial position between the high position H and the low position L in the direction X perpendicular to the bottom wall of the tank 22. The liquid supplying member 28 is configured to supply treatment liquid to the tank 22.

It is obtained from the formula of $v=w*r$ (in which, v is line velocity, w is angle velocity and r is radius) that, since angle velocity w of the main roller 23 is maintained to be a constant value when being rotated, the line velocity v of it is in direct proportion to the radius r thereof and the conveying velocity of the flexible substrate 29 wrapped around the main roller 23 increases with increase of the radius of the main roller 23. In conventional process, it is resulted that immersed time of the flexible substrate 29 in the treatment liquid is reduced.

However, according to embodiment of the invention, in this case, the discharge port position controlling mechanism 272 can be used to adjust the movable discharge port 271 towards the high position H and the treatment liquid is added to the tank 22 by the liquid supplying member 28, wherein the movable discharge port is adjusted to a position where the treatment liquid does not exit from the movable discharge port. Thus, the liquid level of the treatment liquid is increased in the above process.

Due to increase of the treatment liquid in the tank 22, length of the flexible substrate 29 immersed in the treatment liquid is increased. According to the formula of $s=v*t$ (in which, v is line velocity and t is time), as long as the resulted value obtained by dividing length of immersed part of the flexible substrate 29 by the conveying velocity thereof is a constant value, it ensures that the treating time for the immersed part of the flexible substrate 29 in the treatment liquid maintains to be constant with the conveying velocity of the flexible substrate 29 being changed.

When the radius of the main roller 23 is decreased, the conveying velocity of the flexible substrate 29 thereon is decreased. As for the conventional process, the flexible substrate 29 would be treated in the treatment liquid for a prolonged time.

However, according to an embodiment of the invention, in this case, the discharge port position controlling mechanism 272 can be used to adjust the movable discharge port 271 towards the low position L, such that the treatment liquid in the tank 22 is discharged. During this process, the liquid level of the treatment liquid will be decreased.

As the quantity of the treatment liquid in the tank 22 is reduced, length of part of the flexible substrate 29 immersed in the treatment liquid is consequently decreased. According to the formula of $s=v*t$, as long as the resulted value obtained by dividing length of the part of the flexible substrate 29 immersed in the treatment liquid by the conveying velocity thereof is a constant value, it ensures that the treating time for the part of the flexible substrate 29 being immersed in the treatment liquid maintains to be constant with the conveying velocity of the flexible substrate 29 being changed.

In an embodiment, the detecting unit 26 is configured to detect radius or diameter of the main roller 23. Upon the radius or diameter of the main roller 23 being detected to be decreased, the discharge port position controlling mechanism 272 controls the movable discharge port 271 to be moved downward, such that the liquid level of the treatment liquid 21 is decreased. Upon the radius or diameter of the main roller 23 being detected to be increased, the discharge port position controlling mechanism 272 controls the movable discharge port 271 to be moved upward and the liquid supplying member 28 supplies treatment liquid to the tank, such that the liquid level of the treatment liquid is lifted.

In an embodiment, the discharge port position controlling mechanism 272 is configured to control the height of the movable discharge port 271, so that the length of the immersed part of the flexible substrate in the conveying direction thereof is in direct proportion of the radius of diameter of the main roller 23.

In the flexible substrate treatment device according to an embodiment in present invention, the detecting unit detects changes of radius or diameter of the winding rollers and notifies the discharge port position controlling mechanism and the liquid supplying member, so that position of the movable discharge port is adjusted to a higher position and treatment liquid is added, or position of the movable discharge port is adjusted to a lower position to discharge some treatment liquid. As a result, by adjusting the liquid level of the treatment liquid, the length of the immersed flexible substrate in the treatment liquid is changed in proportion with variation of the radius or diameter of wrapped roller, so that the treating time of the flexible substrate in the treatment liquid maintains to be constant, thereby ensuring uniformity in size of devices on the flexible substrate and enhancing qualities of flexible display products.

In the above embodiment, the flexible substrate treatment device further includes a control unit (not illustrated in FIG. 2) configured to transmit detection result from the detecting unit 26 to the discharge port position controlling mechanism 272.

In the flexible substrate treatment device illustrated in FIG. 2, the detecting unit 26 is located adjacent to the main roller 23 to perform detection of radius of the main roller 23. Alternatively, the detecting unit may be located adjacent to the driven roller to measure its radius. According to the radius measured, the discharge port position controlling mechanism and the liquid supplying member are controlled in similar way to the above embodiment and the detailed description about the process is omitted herein.

Figure 3:
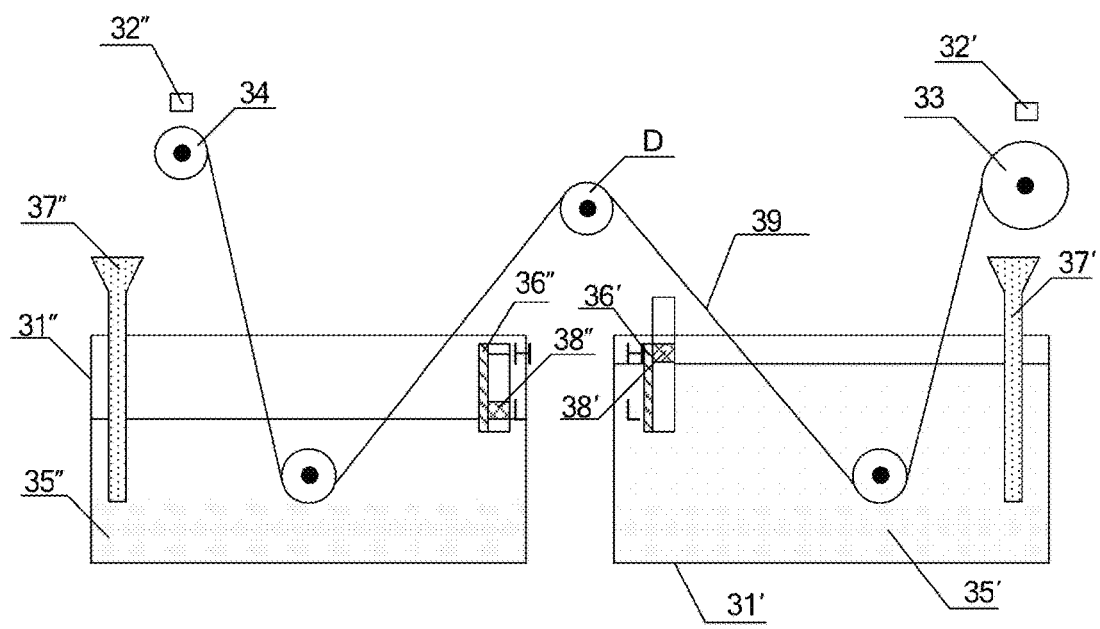
FIG. 3 is a schematic view of a flexible substrate treatment device with double tanks provided according to an embodiment of the present invention.

When the flexible substrate treatment device comprises a plurality of tanks (tank 31' and tank 31"), as illustrated in FIG. 3, two detecting units (32' and 32") may be provided and are located adjacent to the main roller 33 and the driven roller 34 to detect radius thereof, respectively. Detection signals generated by the two detecting units (32' and 32") may be used to control liquid level of treatment liquid in respective tank (tank 31' and tank 31"). For example, the detecting unit 32' is configured to detect radius of the main roller 33 and notify the discharge port position controlling mechanism 36' and the liquid supplying member 37' corresponding to the tank 31', so that adjustment of the liquid level of the treatment liquid 35' is realized. The detecting unit 32" is configured to detect radius of the driven roller 34 and notify the discharge port position controlling mechanism 36" and the liquid supplying member 37" corresponding to the tank 31", so that adjustment of the liquid level of the treatment liquid 35" is realized. Alternatively, the detecting signal of the detecting unit 32' may also be used to control the liquid level of the treatment liquid 35" in the tank 31" while the detecting signal of the detecting unit 32" may be used to control the liquid level of the treatment liquid 35' in the tank 31'.

In FIG. 3, the movable discharge port 38' in tank 31' is located at a high position H while the movable discharge port 38" in tank 31" is located at a low position L. In practice, the position of the movable discharge port is not limited to those illustrated in FIG. 3. A limit roller D may be provided to limit the position of the flexible substrate 39 conveyed between the adjacent tanks (31' and 31").

The above treatment liquid may be etching liquid, cleaning liquid, or stripping liquid, which is used to achieve etching, cleaning or stripping treatment, respectively.

Figure 4:
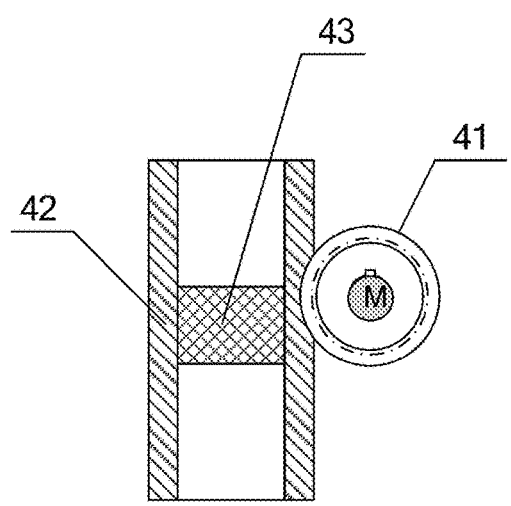
FIG. 4 is a schematic view of a discharge port position controlling mechanism provided according to an embodiment of the present invention.

The above mentioned discharge port position controlling mechanism may includes a stepping motor 41 and a lead screw 42. The stepping motor 41 is configured to drive the lead screw 42 so that the movable discharge port 43 may be moved up and down on the lead screw 42, as illustrated in FIG. 4. Alternatively, the discharge port position controlling mechanism may be any other mechanism structures in the art, which may be configured to enable the movable discharge port to move in the direction perpendicular to the bottom wall of the tank when assembled with the movable discharge port.

In addition, in the flexible substrate treatment device according to the present invention, the liquid supplying member may be configured in any of forms of those structures provided by those skilled in the art to supply treatment liquid, not be limited to those illustrated in FIGS. 2 and 3. The liquid supplying member may include a part located in the corresponding tank and the other part located outside the tank. Alternatively, the liquid supplying member may be entirely located outside the tank.

The above mentioned detecting unit may be a distance sensor. Alternatively, the detecting unit may be a device in the art configured to measure radius or diameter of the winding rollers. In addition, communication means between the detecting unit and the position controlling mechanism may be any communication means known by those skilled in the art, which is not limited in the embodiment of the present invention and omitted to be described herein.

The foregoing are merely exemplary embodiments of the invention, but are not used to limit the protection scope of the invention. The protection scope of the invention shall be defined by the attached claims.

What is claimed is:
1. A flexible substrate treatment device comprising:
   at least one tank that accommodates treatment liquid;
   winding rollers including a main roller and a driven roller located above the treatment liquid;
   a positioning roller located in the treatment liquid in each tank;
   a detector configured to detect radius or diameter of at least one of the winding rollers; and
   a movable discharge member fixed to a side wall of each tank, including a movable discharge port configured to discharge the treatment liquid and a movable discharge port position controller;
   wherein the discharge port position controller is configured to control movement of the corresponding movable discharge port in a direction perpendicular to a bottom wall of the tank based on a detection result of the detector and to control height of the movable discharge port so that length of the part of the flexible substrate immersed in the treatment liquid along the conveying direction is in direct proportion to the radius or diameter of the main roller based on the detection result of the detector,
   wherein the main roller is configured to be rotated at constant angle velocity,
   wherein the movable discharge port is configured to be movable in a direction perpendicular to the bottom wall of the tank,
   wherein the movable discharge port is disposed at a side of the positioning roller away from the bottom wall of the tank so as to control height of a top surface of the treatment liquid.

2. The flexible substrate treatment device according to claim 1, further comprising: a liquid supplying inlet configured to supply treatment liquid into the tank.

3. The flexible substrate treatment device according to claim 2, wherein the liquid supplying inlet includes a part located in the tank and another part located outside the tank.

4. The flexible substrate treatment device according to claim 2, wherein the detector is configured to detect radius or diameter of the main roller; upon the radius or diameter of the main roller being detected to be decreased, the discharge port position controller controls the movable discharge port to move downward so as to decrease the liquid level of the treatment liquid; upon the radius or diameter of the main roller is detected to be increased, the discharge port position controller controls the movable discharge port to move upward and the liquid supplying inlet supply the treatment liquid into the tank so as to increase the liquid level of the treatment liquid.

5. The flexible substrate treatment device according to claim 2, wherein the treatment liquid is etching liquid, cleaning liquid and stripping liquid.

6. The flexible substrate treatment device according to claim 2, wherein the discharge port position controller includes a stepping motor and a lead screw.

7. The flexible substrate treatment device according to claim 2, wherein the detector is a distance sensor.

8. The flexible substrate treatment device according to claim 2, further comprising a controller configured to transmit the detection result from the detector to the discharge port position controller.

9. The flexible substrate treatment device according to claim 2, further comprising a limit roller configured to limit position of the flexible substrate conveyed between two adjacent tanks.

10. The flexible substrate treatment device according to claim 1, wherein the treatment liquid is etching liquid, cleaning liquid or stripping liquid.

11. The flexible substrate treatment device according to claim 10, wherein the detector is configured to detect radius or diameter of the main roller; upon the radius or diameter of the main roller being detected to be decreased, the discharge port position controller controls the movable discharge port to move downward so as to decrease the liquid level of the treatment liquid; upon the radius or diameter of the main roller is detected to be increased, the discharge port position controller controls the movable discharge port to move upward and the liquid supplying inlet supply the treatment liquid into the tank so as to increase the liquid level of the treatment liquid.

12. The flexible substrate treatment device according to claim 1, wherein the discharge port position controller includes a stepping motor and a lead screw.

13. The flexible substrate treatment device according to claim 12, wherein the detector is configured to detect radius or diameter of the main roller; upon the radius or diameter of the main roller being detected to be decreased, the discharge port position controller controls the movable discharge port to move downward so as to decrease the liquid level of the treatment liquid; upon the radius or diameter of the main roller is detected to be increased, the discharge port position controller controls the movable discharge port to move upward and the liquid supplying inlet supply the treatment liquid into the tank so as to increase the liquid level of the treatment liquid.

14. The flexible substrate treatment device according to claim 1, wherein the detector is a distance sensor.

15. The flexible substrate treatment device according to claim 1, further comprising a controller configured to transmit the detection result from the detector to the discharge port position controller.

16. The flexible substrate treatment device according to claim 1, wherein two detectors are provided and used to detect radius or diameter of the main roller and the driven roller, respectively.

17. The flexible substrate treatment device according to claim 1, further comprising a limit roller configured to limit position of the flexible substrate conveyed between two adjacent tanks.

18. The flexible substrate treatment device according to claim 1, wherein a top surface of the treatment liquid is level with a bottom of the movable discharge port.

* * * * *